(12) United States Patent
Hattori (10) Patent No.: US 6,355,951 B1
(45) Date of Patent: Mar. 12, 2002

(54) FIELD EFFECT SEMICONDUCTOR DEVICE

(75) Inventor: Ryo Hattori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/445,957

(22) PCT Filed: Jul. 24, 1997

(86) PCT No.: PCT/JP97/02559

§ 371 Date: Dec. 16, 1999

§ 102(e) Date: Dec. 16, 1999

(87) PCT Pub. No.: WO99/05725

PCT Pub. Date: Feb. 4, 1999

(51) Int. Cl.[7] .............................................. H01L 33/00
(52) U.S. Cl. ........................ 257/280; 257/192; 257/194
(58) Field of Search ................................ 257/192, 194, 257/196, 281, 280; 438/147, 174, 175

(56) References Cited

U.S. PATENT DOCUMENTS

| 5,124,770 A | | 6/1992 | Umenoto et al. | |
|---|---|---|---|---|
| 5,266,506 A | * | 11/1993 | Green, Jr. ................... | 437/41 |
| 5,466,955 A | * | 11/1995 | Maruhashi et al. .......... | 257/192 |
| 5,668,387 A | * | 9/1997 | Streit et al. ................. | 257/192 |
| 5,739,557 A | * | 4/1998 | O'Neil, II et al. .......... | 257/192 |
| 5,767,539 A | * | 6/1998 | Onda .......................... | 257/194 |
| 5,981,980 A | * | 11/1999 | Miyajima et al. ........... | 257/103 |

FOREIGN PATENT DOCUMENTS

| JP | 62- 81767 | 4/1987 |
|---|---|---|
| JP | A5109622 | 4/1993 |
| JP | A6-140430 | 5/1994 |
| JP | A8-153733 | 6/1996 |

* cited by examiner

Primary Examiner—Stephen D. Meier
(74) Attorney, Agent, or Firm—Birch, Stewart, Kolasch & Birch, LLP (57) ABSTRACT

In a field effect transistor such as high output FET or low noise HEMT, a layer for facilitating re-combination of carriers (for example a superlattice buffer layer), an undoped compound semiconductor layer having a higher resistance than a channel layer and the channel layer made of a compound semiconductor are layered successively. In the layer for facilitating re-combination of carriers, for example, oxygen of high concentration is introduced, to facilitate the non-radiative recombination which shortens the life of injected carriers. The layer for facilitating re-combination of carriers is also formed by forming the superlattice layer at a lower temperature than the channel layer. Thus, efficiency and voltageproofness on high frequency, high output power operation is improved further, and noises can be decreased further on high frequency, low noise operation.

16 Claims, 12 Drawing Sheets

FIELD EFFECT SEMICONDUCTOR DEVICE

This application is the national phase under 35 U.S.C. §371 of PCT International Application No. PCT/JP97/02559 which has an International filing date of Jul. 24, 1997, which designated the United States of America.

BACKGROUND OF THE INVENTION

1. Technical Field

The present invention relates to a field effect transistor, in particular, to a device structure of compound semiconductor field effect transistor for realizing higher efficiency and higher voltageproofness in high frequencies, and high output power operation and for realizing lower noises in high frequency, low noise operation.

2. Background Art

Devices made of a compound semiconductor such as GaAs have been used in various uses not realized by silicon devices. A superlattice structure wherein GaAs and AlGaAs very thin films are grown in layers is also used in compound semiconductor devices. Devices using superlattice structure include a high output power field effect transistor (FET) and a low noise high mobility transistor (HEMT). The superlattice structure is fabricated with epitaxial growth. For example, an AlGaAs/GaAs superlattice layer is formed as a buffer layer at an interface between a substrate and an epitaxial layer, to suppress propagation of crystalline dislocations from the substrate to the epitaxial layer and multiplication thereof, a good epitaxial layer can be fabricated.

A GaAs high output power FET is used in a high output power amplifier for communication at high frequencies equal to or higher than 1 GHz. Main factors in a GaAs high output power FET which limit the output power and the electric power addition efficiency in high frequency, high output power operation are self-multiplication due to ionization on collisions of free electrons in the GaAs material, current leakage down below the channel layer and current leakage at crystalline surfaces between the electrodes.

On the other hand, a low noise high mobility transistor is used in a low noise amplifier for communication at high frequencies equal to or higher than 10 GHz. In a low noise high mobility transistor, the electron transport characteristics of the channel layer is improved in order to improve noise characteristics. However, even if the characteristics of the channel layer is improved, free electrons leak below the channel due to short channel effect because a very small gate electrode has to be used. This limits reduction of noises.

A first object of the invention is to provide a high output power field effect transistor having improved overinputproofness, voltageproofness and efficiency.

A second object of the invention is to provide a field effect transistor having improved noise characteristics.

DISCLOSURE OF INVENTION

A first field effect transistor device according to the invention comprises a channel layer made of a compound semiconductor, a first compound semiconductor layer formed below the channel layer and having a higher resistance than the channel layer, and a second compound semiconductor layer formed below the first compound semiconductor layer and facilitating re-combination of carriers.

Preferably, the second compound semiconductor layer comprises a layer made of a material including aluminum, and oxygen is introduced in the material including aluminum. Because aluminum combines easily with oxygen, oxygen of high concentration can be mixed easily.

Preferably, the second compound semiconductor layer comprises a superlattice structure consisting of layers made of a plurality of different crystalline materials and at least a part of the layers facilitate the re-combination of carriers.

Preferably, the superlattice structure consists of layers made of a semiconductor crystalline material including aluminum and layers made of another semiconductor crystalline material without aluminum.

Preferably, the superlattice structure has a structure wherein $Al_xGa_{1-x}As$ (x>0) layers and $Al_yGa_{1-y}As$ (x>y≧0) layers are layered alternately, and oxygen concentration in the $Al_xGa_{1-x}As$ layers is in a range from $1*10^{17}$ to $2*10^{19}$ $cm^{-3}$, more preferably, in a range from $1*10^{18}$ to $7*10^{18}$ $cm^{-3}$.

Preferably, the second compound semiconductor layer comprises a layer wherein both of n-type and p-type dopants are mixed at about the same degree. The second compound semiconductor layer has a high resistance due to carrier compensation, to facilitate re-combination of carriers.

A second field effect transistor device according to the invention comprises a channel layer made of a compound semiconductor, a first compound semiconductor layer formed below the channel layer and having a higher resistance than the channel layer, and a second compound semiconductor layer formed below the first compound semiconductor layer and facilitating re-combination of carriers. The second compound semiconductor layer is a layer formed with crystal growth at a temperature lower than the channel layer. Due to crystal growth at a lower temperature, the crystalline property is deteriorated to enhance carrier re-combination rate.

Preferably, the second compound semiconductor layer is a layer formed with crystal growth at a temperature lower than that of the channel layer. Preferably, the second compound semiconductor layer is a layer formed with crystal growth at a temperature lower by 20 to 200° C., more preferably, by 100 to 150° C., than that of the channel layer. The second semiconductor layer comprises a superlattice structure consisting of a plurality of layers of different crystalline materials, and at least a part thereof are layers which facilitate re-combination-of carriers.

BEST MODES FOR CARRYING OUT THE INVENTION

Referring now to the drawings, embodiments of the invention are explained below.

Figure 1:
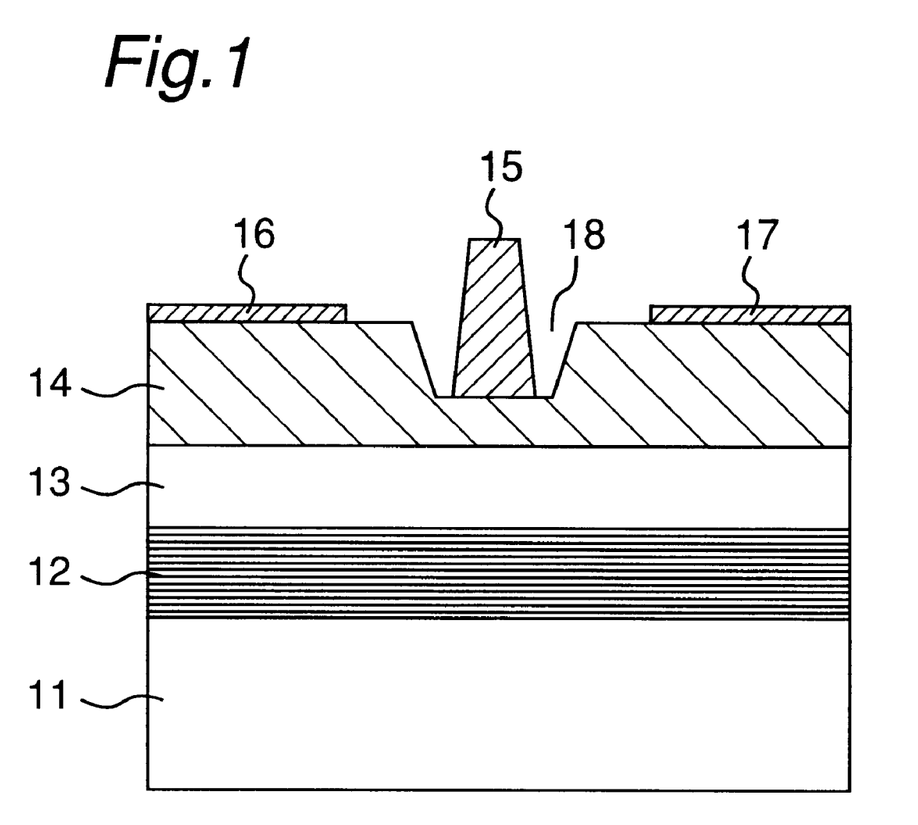
FIG. 1 is a schematic sectional view of a GaAs high output power FET according to the invention.

FIG. 1 is a schematic sectional view of a GaAs field effect transistor (FET) of high output power according to an embodiment of the invention. On a semi-insulating GaAs substrate 11, a superlattice buffer layer 12 is fabricated by forming 40 layers wherein AlGaAs layers mixed with $5*10^{18}$ cm$^{-3}$ of oxygen and GaAs layers are formed alternately. The thickness of each layer in the superlattice structure is equal to or smaller than 20 nm. In this example, the thickness of the AlGaAs layer is 15 nm and that of the GaAs layer is 5 nm. A high purity undoped GaAs layer 13 of 300 nm thickness is formed, and a channel layer 14 made of n-GaAs of $1*10^{17}$ cm$^{-3}$ of 500 nm thickness is formed further on the superlattice buffer layer 12. The undoped layer 13 is for example a semiconductor layer having carrier concentration equal to or smaller than $10^{16}$ cm$^{-3}$, but it may be generally a layer having a higher resistance than the channel layer 14. These semiconductor layers are grown with molecular beam epitaxy (MBE) or metallo-organic vapor phase epitaxy (MOVPE). Further, a recess groove 18 is formed at the center at the top of the n-GaAs channel layer 14, and a gate electrode 15 is formed at the center of the recess groove 18. Further, a source electrode 16 and a drain one 17 are formed on the channel layer 14 at the two sides with respect to the recess groove 18.

It is a common knowledge not to introduce oxygen in the superlattice buffer layer because oxygen atoms form deep trap levels in a band gap. The high output power FET of this embodiment is characterized in mixing of high concentration oxygen. For comparison with the FET of this embodiment, an FET is fabricated which has the same structure as shown in FIG. 1 except that the amount of mixed oxygen is equal to smaller than $2*10^{16}$ cm$^{-3}$, and various properties are measured thereon. The electric power addition efficiency of the FET of the comparison example is about 53% at 4 GHz at 1 W of output power. On the other hand, that of the GaAs high output power FET having the structure shown in FIG. 1 is increased to about 60% at 4 GHz at 1 W of output power. Further, as to the direct current characteristic, the gate voltageproofness is improved by about 15% on the FET of the embodiment, and the pinch-off characteristic (difference LVp of the pinch-off voltage at $V_{DS}$=3V/5V) becomes equal to or smaller than ½ of that of the comparison example.

Figure 2:
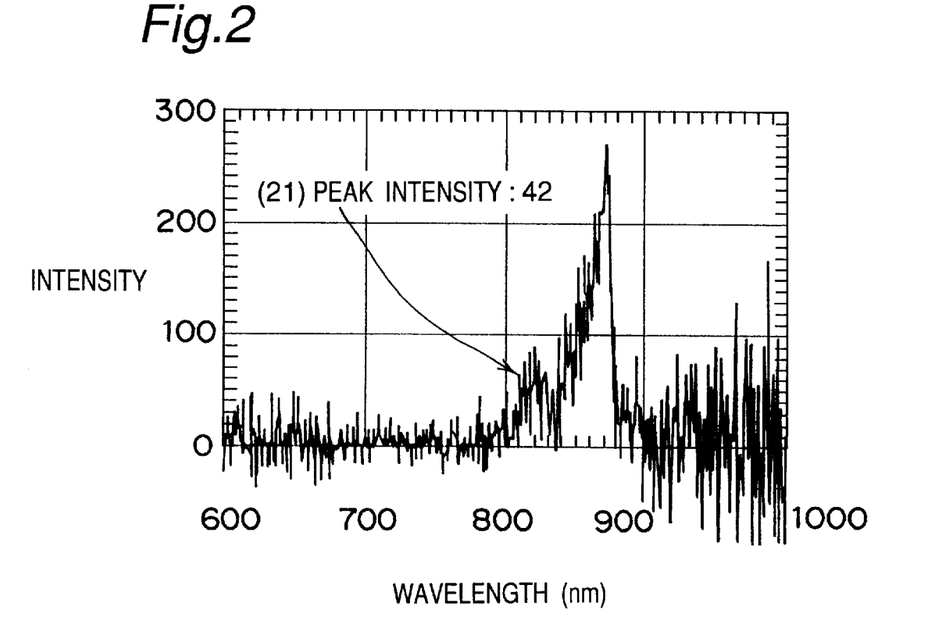
FIG. 2 is a graph of room temperature photoluminescence spectra measured on a state where a superlattice layer of high oxygen concentration and an undoped GaAs high resistance layer are formed successively on a semi-insulating substrate.
Figure 3:
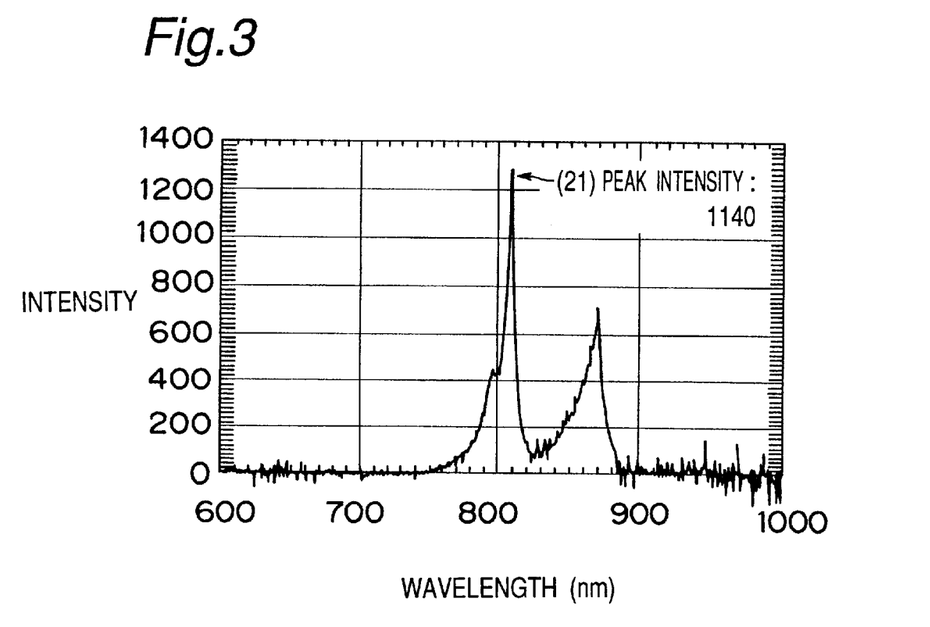
FIG. 3 is a graph of room temperature photoluminescence spectra measured on a state (comparison example) where a superlattice layer of low oxygen concentration and an undoped GaAs high resistance layer are formed successively on a semi-insulating substrate.

This improvement of the characteristics is ascribed to the superlattice layer 12 which is operated as a crystalline layer to facilitate the re-combination of carriers (that is, a carrier killer layer which has short re-combination life time of injected carriers). The increase in non-radiative re-combination due to increase in oxygen concentration is confirmed by photoluminescence measurement. FIG. 2 shows room temperature photoluminescence spectra measured on a state where the superlattice layer 12 of high oxygen concentration and the undoped GaAs layer 13 are formed successively on the semi-insulating substrate 11. Further, FIG. 3 shows room temperature photoluminescence spectra measured on a state (comparison example) where a superlattice layer of low oxygen concentration and an undoped GaAs high resistance layer are formed successively on a semi-insulating substrate. In FIGS. 2 and 3, the axis of ordinate represents radiative intensity (arbitrary unit) and that of abscissa represents wavelength (nm). In the drawings, reference number 21 represents radiation from GaAs quantum levels. The wavelength of the radiation at the GaAs levels in the superlattice buffer layer is shifted from the wavelength (about 870 nm) in the conventional GaAs layer to about 800 nm due to the quantum effect. The radiation intensity for the FET having the superlattice layer 12 of high oxygen concentration shown in FIG. 2 becomes as weak as about ⅟30 of the FET having the superlattice layer of low oxygen concentration shown in FIG. 3. This shows that the non-radiative re-combination rate of the carriers excited in the superlattice buffer layer 12 is increased due to mixing of oxygen. That is, the re-combination of carriers is facilitated in the superlattice buffer layer 12 due to the mixing of high concentration oxygen.

As explained above, the FET has, below the channel layer 14 as an active layer, a first crystalline buffer layer (undoped layer 13) having a higher resistance (or a longer re-combination life of injected carriers) than the channel layer 14 and a second buffer layer (superlattice buffer layer 12) which has high resistance and facilitates the re-combination of injected carriers. The superlattice buffer layer 12 is operated as a carrier killer layer having a short re-combination life of the injected carriers. Carriers which arrive to the superlattice layer 12 having the short re-combination life of the injected carriers move from the trap levels of oxygen in the AlGaAs layer to the quantum levels in the GaAs layer to perform the re-combination without radiation in a short time. Therefore, the carriers at the trap levels of oxygen, without returning to the upper levels, flow fast to the lower energy levels and are annihilated due to the non-radiative re-combination. Thus, self-multiplication due to ionization on collisions of free electrons, current leakage down below the channel layer and current leakage at crystalline surfaces between the electrodes are suppressed to improve the characteristics of the FET.

Figure 4:
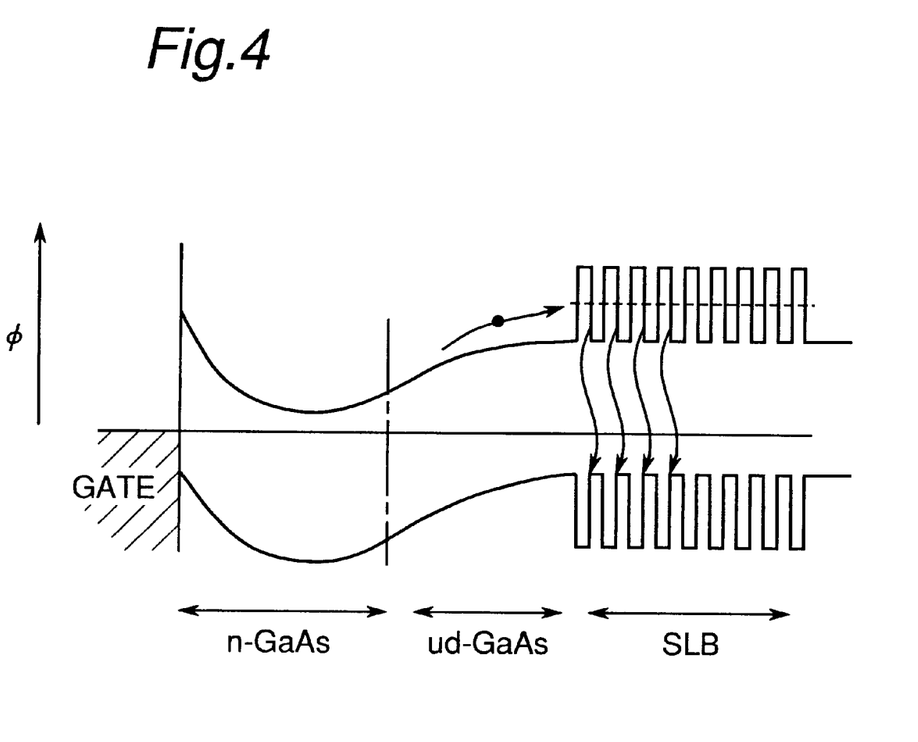
FIG. 4 is a schematic diagram of energy bands.

The fast re-combination due to non-radiative re-combination is explained with reference to energy bands shown schematically in FIG. 4. Carriers which arrive through the channel layer (n-GaAs layer) 14 to the undoped layer (ud-GaAs layer) 13 flow easily to the superlattice buffer layer (SLB) 12. Then, they move to the quantum levels in the GaAs layer in the superlattice buffer layer 12 and perform the non-radiative re-combination quickly to fall to the lower energy levels in the band gap and are annihilated. If an AlGaAs layer doped with oxygen for higher resistance is used instead of the superlattice layer, the carriers which flow to the undoped layer (GaAs layer) pass over the energy barrier to the AlGaAs layer only a little, so that the re-combination of the carriers is not facilitated.

Figure 5:
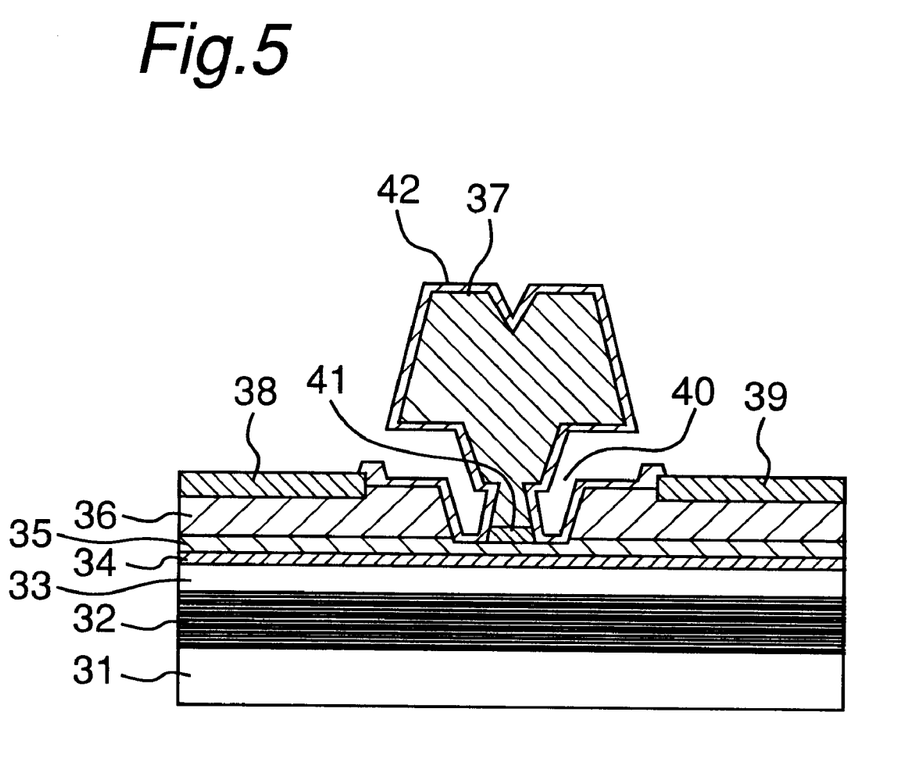
FIG. 5 is a schematic diagram of a GaAs HEMT according to the invention.

FIG. 5 is a schematic diagram of a GaAs low noise FET (HEMT) according to a second embodiment of the invention. On a semi-insulating GaAs substrate 31, a superlattice buffer layer 32 is fabricated by forming 40 layers wherein AlGaAs layers mixed with $2*10^{17}$ cm$^{-3}$ of oxygen (of thickness of 15 nm) and GaAs layers (of thickness of 5 nm) are formed alternately. An undoped GaAs layer 33 (of thickness of 300 nm) and an undoped InGaAs channel layer 34 are formed on the superlattice layer 32. On the channel layer 34, an n-AlGaAs layer 35 and an n$^+$-GaAs layer 36 are formed further. A recess groove 40 is formed at the center of the n$^+$-GaAs layer 36, and a gate electrode 37 is formed at the center of the recess groove 40. In order to improve the Schottky junction, a TiAl layer 41 is formed between the gate electrode 37 and the n-AlGaks layer 35. Further, a source electrode 38 and a drain one 39 are formed on the n$^+$-GaAs layer 36 at both sides with respect to the recess groove 40. A passivation film 42 is formed on the gate electrode 38 and the like.

The low noise HEMT also has a characteristic that an amount of mixed oxygen is increased. For comparison, an FET of comparison example is fabricated which is the same structure as that shown in FIG. 5 except that the amount of mixed oxygen is equal to or smaller than $2*10^{16}$ cm$^{-3}$, and various properties are measured thereon. The noise figure NF of the FET of comparison example is about 0.53 dB at 12 GHz. On the contrary, that of the GaAs FET having the structure shown in FIG. 5 is improved to about 0.47 dB at 12 GHz.

The improvement of the characteristics is ascribed to the superlattice buffer structure 32 which is operated as a crystalline layer to facilitate the re-combination of injected carriers. That is, the FET also has, below the channel layer 34, a first crystalline buffer layer (undoped layer 33) having a higher resistance and a longer re-combination life of injected carriers and a second crystalline buffer layer (superlattice buffer layer 32) which has high resistance and shorter re-combination life of injected carriers. Carriers which arrive to the superlattice layer 32 perform the re-combination without radiation at the impurity levels of oxygen in a short time. Therefore, the carriers at the trap levels, without returning to the upper levels, flow fast to the lower energy levels and are annihilated. Thus, current leakage down below the channel layer 34 is suppressed, and the noise characteristics of the FET are improved.

Figure 6:
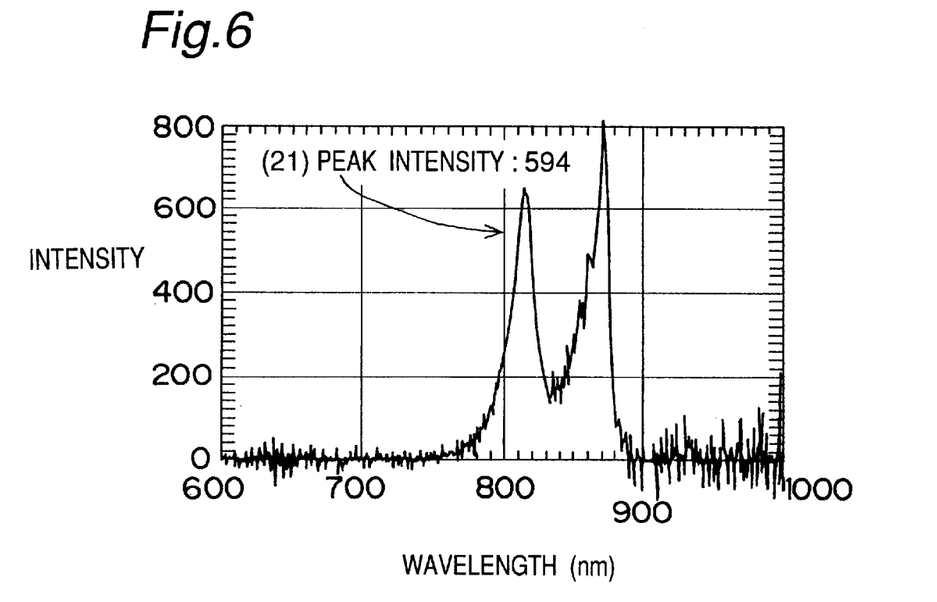
FIG. 6 is a graph of room temperature photoluminescence spectra measured on a state where a superlattice layer of high oxygen concentration and an undoped GaAs high resistance layer are formed successively on a semi-insulating substrate.
Figure 7:
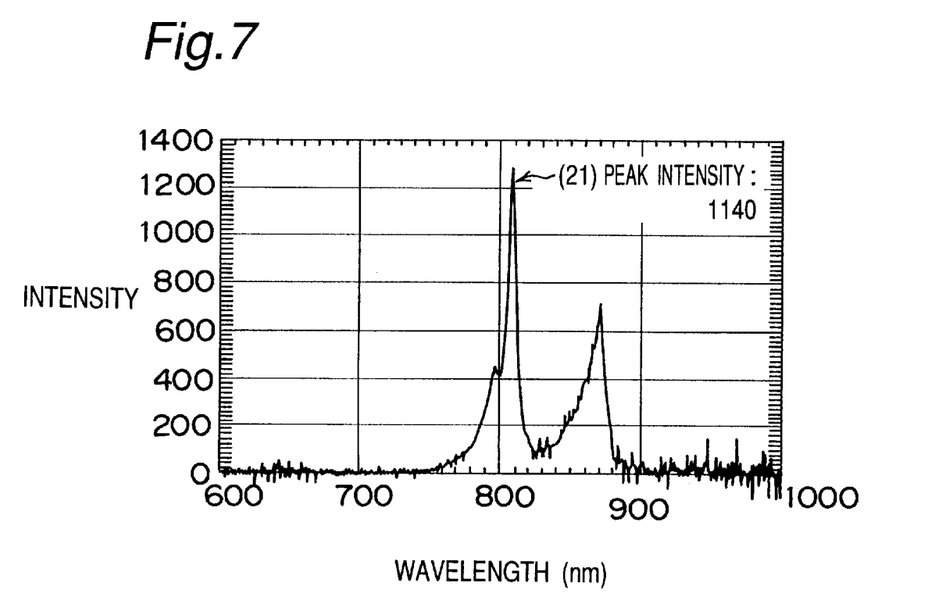
FIG. 7 is a graph of room temperature photoluminescence spectra measured on a state (comparison example) where a superlattice layer of low oxygen concentration and an undoped GaAs high resistance layer are formed successively on a semi-insulating substrate.

The increase in non-radiative re-combination is confirmed by photoluminescence measurement. FIG. 6 shows room temperature photoluminescence spectra measured on a state where the high oxygen concentration superlattice layer 32 and the undoped GaAs high resistance layer 33 are formed successively on the semi-insulating substrate 31. Further, FIG. 7 shows room temperature photoluminescence spectra (comparison example) measured on a state where a low oxygen concentration superlattice layer and an undoped GaAs high resistance layer are formed successively on a semi-insulating substrate. In FIGS. 6 and 7, the axis of ordinate represents radiative intensity (arbitrary unit) and that of abscissa represents wavelength (nm). In the drawings, reference number 21 represents radiation from GaAs quantum levels. The radiation intensity for the FET having the superlattice layer 32 of high oxygen concentration shown in FIG. 6 becomes as weak as about ½ of the FET having the superlattice layer of low oxygen concentration shown in FIG. 7. This shows that the non-radiative re-combination rate of the carriers excited in the superlattice buffer layer is increased and that the re-combination of carriers is facilitated due to the mixing of high concentration oxygen.

The superlattice structure in the semiconductor devices in the above-mentioned two embodiments is explained further. The superlattice structure consists of layers of a semiconductor crystalline material including aluminum and another semiconductor crystalline material without aluminum. Oxygen of high concentration is mixed as impurity in the layers of the semiconductor crystalline material including aluminum because it is combined easily with aluminum.

The amount of oxygen on doping is preferably in a range from $1*19^{17}$ to $4*10^{19}$ cm$^{-3}$, more preferably, in a range from $1*10^{18}$ to $7*10^{18}$ cm$^{-3}$.

The superlattice structure explained above is an AlGaAs/GaAs superlattice structure. Generally, in an Al$_x$Ga$_{1-x}$As (x>0)/Al$_y$Ga$_{1-y}$As (x>y≧0) superlattice structure, the re-combination of carriers can be facilitated by doping oxygen of high concentration in the Al$_x$Ga$_{1-x}$As layers therein. The oxygen concentration in the Al$_x$Ga$_{1-x}$As layers is preferably in a range from $1*10^{17}$ to $2*10^{19}$ cm$^{-3}$, more preferably in a range from $1*10^{18}$ to $7*10^{18}$ cm$^{-3}$.

The superlattice buffer layer 12 may be made of AlGaInP, AlInAs, AlGaP or the like, besides the AlGaAs used above.

The superlattice structure is used in the above-mentioned embodiments. The superlattice structure refers to a structure consisting of layers having thin thickness smaller than the Bohr radius of electron (about 10 to 15 nm) in a material. However, the above-explained device structure using a crystalline layer which facilitates the re-combination of carriers can also be applied to a structure including a layer having a thickness larger than the Bohr radius.

Figure 8:
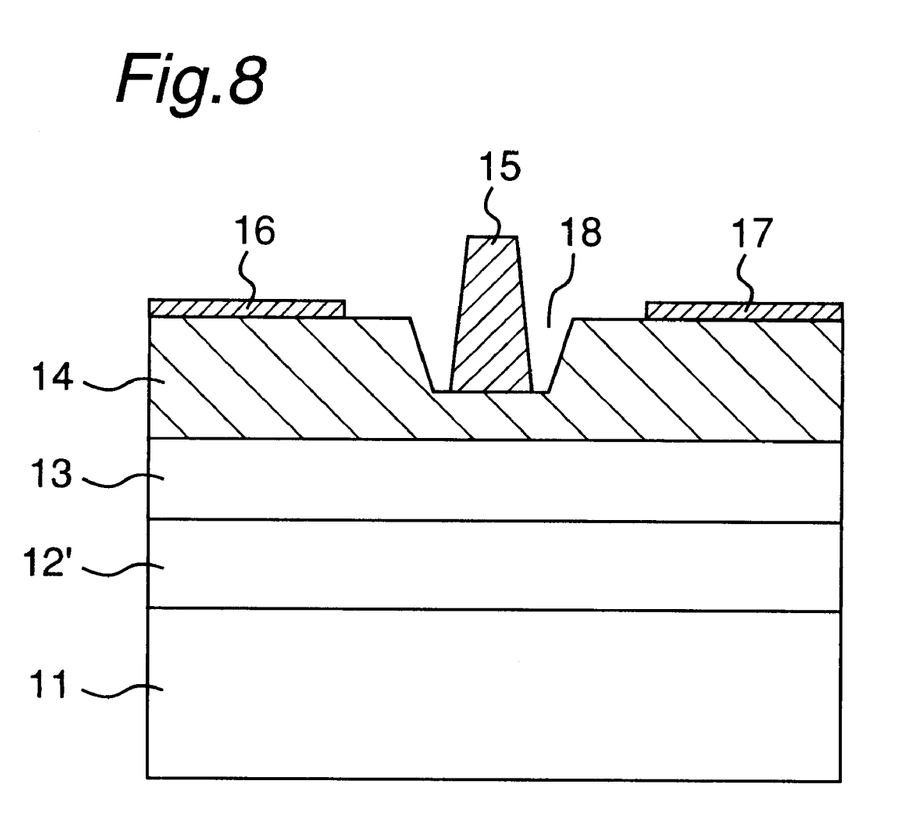
FIG. 8 is a schematic sectional view of a GaAs high output power FET according another embodiment of the invention.

FIG. 8 shows a high output power FET wherein a layer 12' for facilitating re-combination of carriers of one layer, instead of the superlattice buffer layer 12 used above. The FET has, below the channel layer 14 as an active layer, a first crystalline buffer layer (for example undoped layer 13) having a higher resistance (or a longer re-combination life of injected carriers) than the channel layer 14 and a second buffer layer 12' (for example a single layer of AlGaAs doped with oxygen) which has high resistance and facilitates the re-combination of injected carriers. In this structure, it is found that the first buffer layer 13 is necessary on the effect of facilitating the re-combination of injected carriers. The oxygen concentration and the composition are also similar to the above-mentioned superlattice structure, but detailed explanation thereon is omitted here. The same holds also for other embodiments to be explained later.

Figure 9:
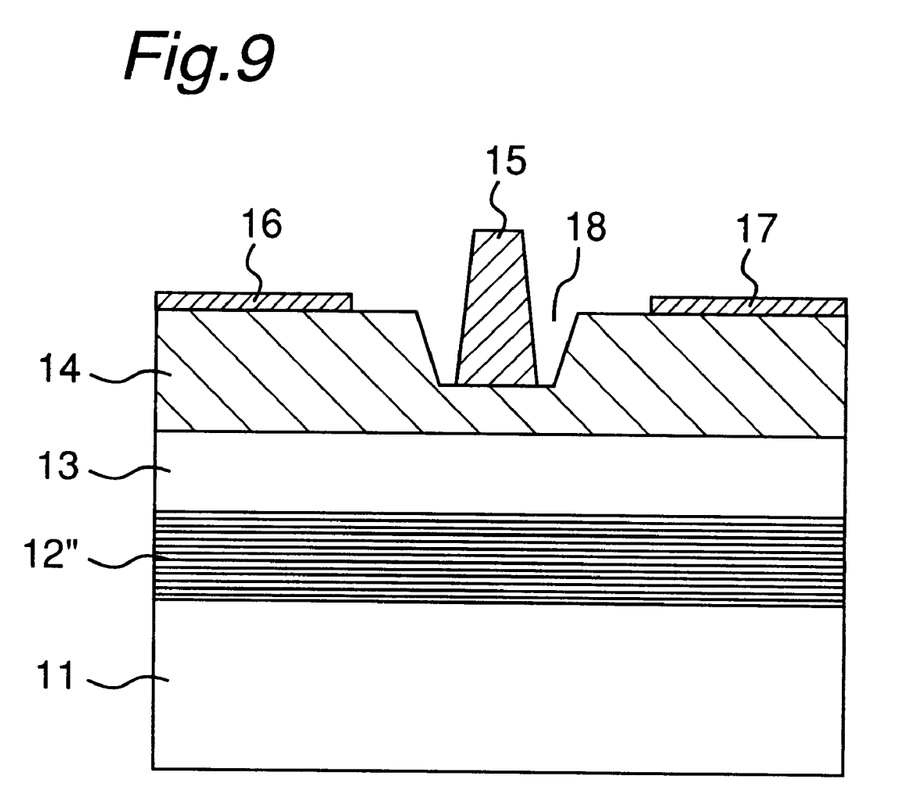
FIG. 9 is a schematic sectional view of a GaAs high output power FET according to a different embodiment of the invention.

Further, as shown in FIG. 9, the layer for facilitating the re-combination of injected carriers may be a crystalline layer 12" where both of n type and p type dopants are mixed at about the same degree in a compound semiconductor (such as AlGaAs) to increase the resistance, instead of the superlattice buffer layer with mixed oxygen explained above.

Next, other embodiments of the inventions are explained. In the above-mentioned embodiments, oxygen of high concentration is mixed for facilitating re-combination of carriers. However, it is found that the re-combination of carriers can also be facilitated by setting a lower crystal growth temperature of a layer wherein the re-combination of carriers has to be facilitated than that of the channel layer. This shows that crystalline distortion introduced in the superlattice structure due to the crystal growth at a lower temperature than the channel layer facilitates the re-combination of carriers. Thus, in the semiconductor device according to an embodiment of the invention, a crystalline layer which accelerates the re-combination of carriers can be formed, without introducing oxygen of high concentration, by growing the superlattice structure at a low growth temperature. The re-combination of carriers is confirmed by measurement of room temperature photoluminescence as will be explained later.

Figure 10:
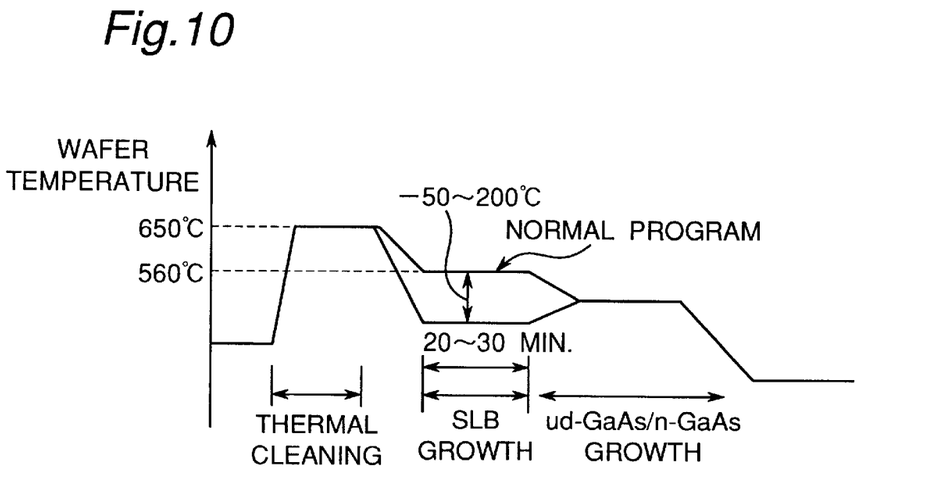
FIG. 10 is a diagram of a growth program by using molecular beam epitaxy.

FIG. 10 shows an example of a growth program by using molecular beam epitaxy, wherein the axis of ordinate represents wafer temperature and that of abscissa represents time. In a conventional case, thermal cleaning of wafer (substrate) is performed at a wafer temperature higher than 650° C. Next, the temperature is decreased to 650° C., and a superlattice buffer layer (SLB) consisting of AlGaAs layers and GaAs layers is grown in 20 to 30 minutes. Next, an undoped GaAs layer and an n-GaAs carrier layer are grown successively at substantially the same temperature or at a somewhat lower temperature. On the other hand, in this embodiment, after the thermal cleaning is performed conventionally, a superlattice layer is grown at a temperature lower by 50 to 200° C. than the growth temperature for an undoped GaAs layer (high temperature layer) and a carrier layer to be grown later. The range of the decrease in the growth temperature is found preferable by considering the mobility $\mu$ and NS. More preferably, it is grown at a temperature lower by 100 to 150° C. Next, on the superlattice buffer layer, the undoped GaAs layer and the carrier layer are grown at a growth temperature higher than that for the superlattice buffer layer.

Figure 11:
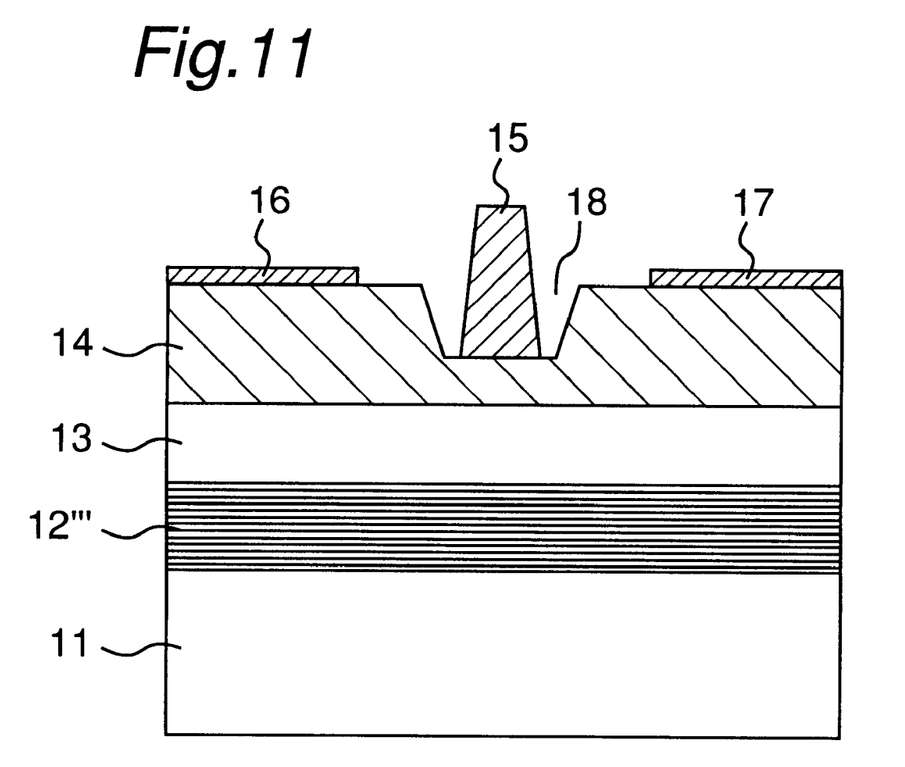
FIG. 11 is a schematic sectional view of a GaAs high output power FET according to the invention fabricated with low temperature crystal growth.

FIG. 11 shows a high output power FET having a superlattice layer 12'" fabricated with the above-mentioned low temperature crystal growth and used as a layer for facilitating the re-combination of carriers. The FET is the same as that shown in FIG. 1, except that the superlattice layer 12'" is grown at the low crystal growth temperature. As explained above, in the fabrication of the FET, after performing the thermal cleaning of a wafer (semi-insulating GaAs substrate) 11, the temperature of the wafer is decreased, and the superlattice layer 12'" consisting of AlGaAs layers and GaAs layers formed alternately up to 40 layers on the wafer 11 at a temperature lower than the conventional crystal growth temperature. Next, the temperature of the wafer is increased, and a high purity undoped GaAs layer 13 (thickness of 300 mm) is formed on the superlattice buffer layer 12'", and an n-GaAs channel layer 14 ($10^{17}$ cm$^{-3}$, thickness of 500 nm) is formed thereon. The semiconductor layers are grown with molecular beam epitaxy (MBE) or metallo-organic vapor phase epitaxy (MOVPE). Next, a recess groove 18 is formed at the center on the n-GaAs channel layer 14, and a gate electrode 15 is formed at the center of the recess groove 18. Further, a source electrode 16 and a drain one 17 are formed on the channel layer 14 at two sides with respect to the recess groove 18.

A method of fabricating the field effect transistor is explained more generally. On a substrate (for example, semi-insulating GaAs substrate), a second compound semiconductor layer which facilitates the re-combination of carriers is formed. The second compound semiconductor layer is formed with crystal growth at a temperature lower than that for a channel layer to be mentioned later. For example, the crystal growth temperature is set at a temperature lower by 50 to 200° C., more preferably by 100 to 150° C., than the growth temperature for the channel layer. For example, the second compound semiconductor layer includes a superlattice structure consisting of layers made of a plurality of different crystalline materials, and at least a part of the layers in the superlattice structure facilitate the re-combination of carriers. It may also be a layer of single layer. Next, on the second compound semiconductor layer, a first compound semiconductor layer having a higher resistance than the channel layer is formed. Next, on the first compound semiconductor layer, the channel layer made of a compound semiconductor is formed.

A structure above the channel layer is different among various field effect transistors. In a high output power FET as shown in FIG. 1, the recess groove is formed at the center on the channel layer, and the gate electrode is formed at the center of the recess groove. Further, source and drain electrodes are formed on the channel layer at two sides with respect to the recess groove. On the other hand, in a low noise HEMT as shown in FIG. 5, the n-type semiconductor layer and the n$^+$-type semiconductor layer are formed successively on the channel layer. Next, the recess groove is formed at the center of the n$^+$ type semiconductor layer down to the n-type one, and the gate electrode is formed at the center of the recess groove. Further, the source and drain electrodes are formed on the n$^+$-type semiconductor layer at two sides with respect to the recess groove.

Figure 12:
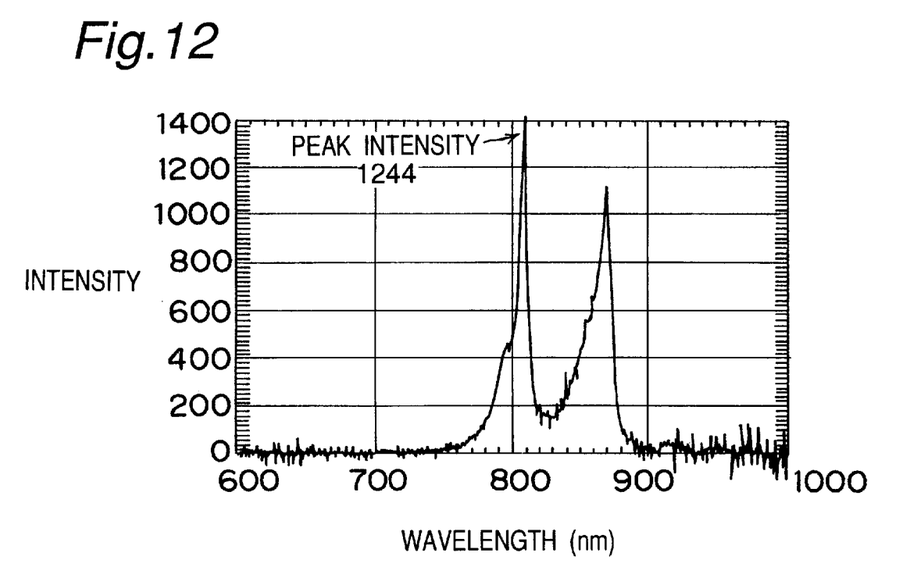
FIG. 12 is a graph of room temperature photoluminescence spectra measured on a state where a high oxygen concentration superlattice layer and an undoped GaAs high resistance layer are formed successively on a semi-insulating substrate.
Figure 13:
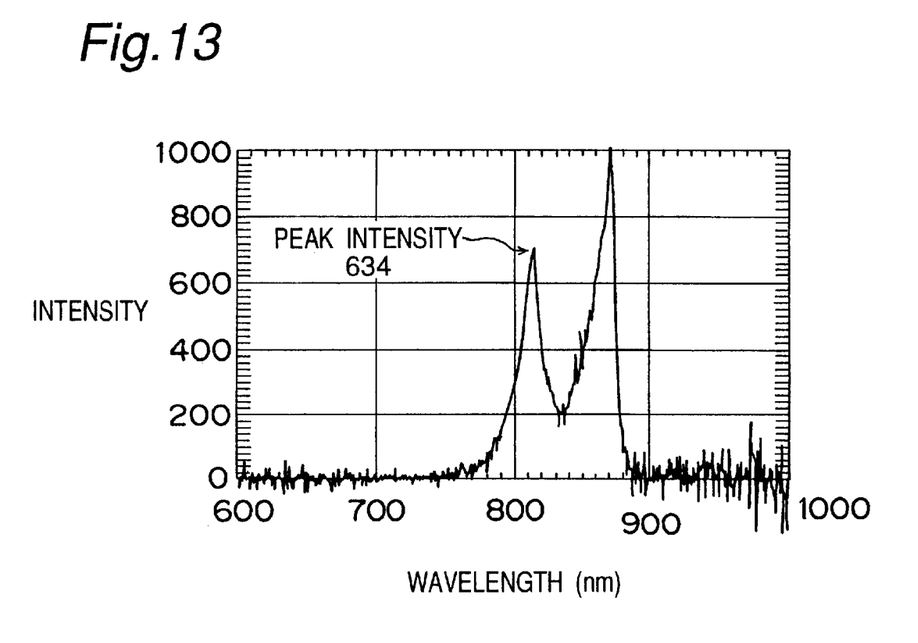
FIG. 13 is a graph of room temperature photoluminescence spectra measured on a state where a superlattice layer of high oxygen concentration and an undoped GaAs high resistance layer are formed successively on a semi-insulating substrate.
Figure 14:
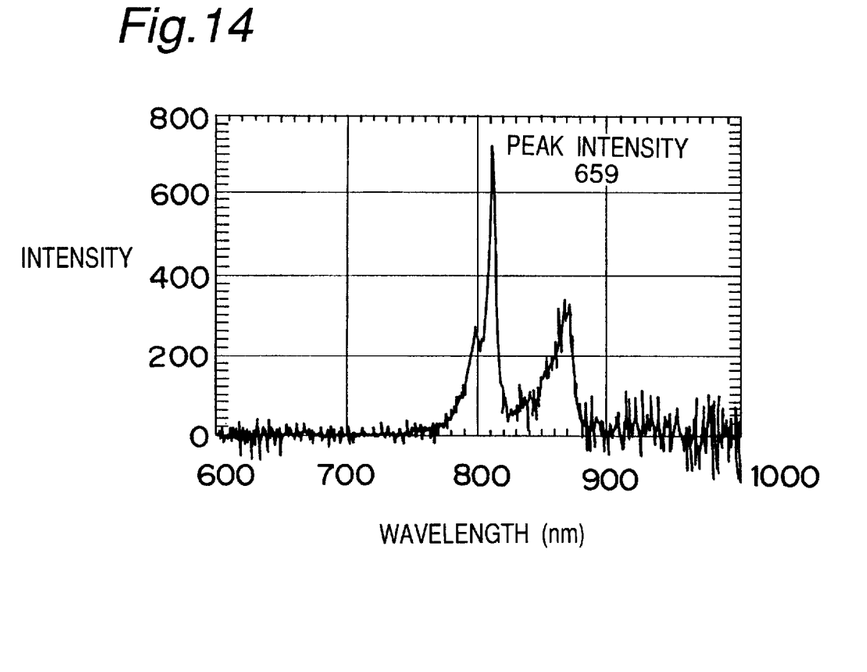
FIG. 14 is a graph of room temperature photoluminescence spectra measured on a state where a superlattice layer of high oxygen concentration (low temperature growth layer) and an undoped GaAs high resistance layer are formed successively on a semi-insulating substrate.
Figure 15:
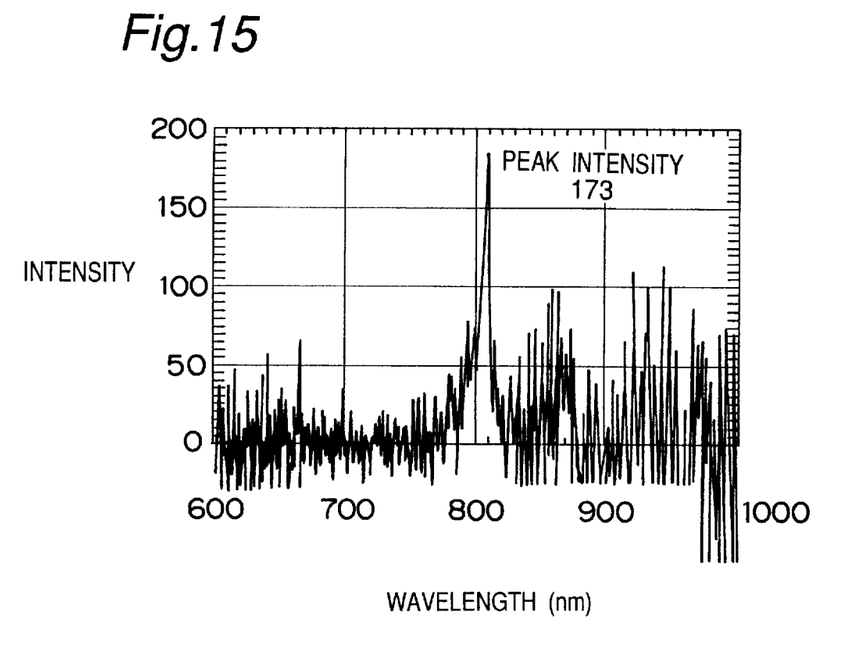
FIG. 15 is a graph of room temperature photoluminescence spectra measured on a state where a superlattice layer of high oxygen concentration (low temperature growth layer) and an undoped GaAs high resistance layer are formed successively on a semi-insulating substrate.

FIGS. 12 to 15 show measurement data of photoluminescence for explaining an effect of low temperature growth. FIGS. 12 and 13 show comparison data when the superlattice buffer layer is grown at the conventional growth temperature ($T_g$=560° C.). FIG. 12 shows measurement data when the oxygen concentration in the AlGaAs layer in the superlattice buffer layer is smaller than $2*10^{16}$ cm$^{-3}$, and FIG. 13 shows measurement data when the oxygen concentration is smaller than $1*10^{17}$ cm$^{-3}$ (in correspondence to the first embodiment). On the other hand, FIGS. 14 and 15 show measurement data when the oxygen concentration in the AlGaAs layer is smaller than $2*10^{16}$ cm$^{-3}$ and when the growth temperature of the superlattice buffer layer is lower by 100° C. and by 200° C., respectively, than the cases shown in FIGS. 12 and 13. It is apparent that the data shown in FIG. 14 has the peak intensity decreased to about a half of the data shown in FIG. 12 on the same oxygen concentration and that it is about the same as that shown in FIG. 13 wherein the oxygen concentration is increased. The data shown in FIG. 15 has the peak intensity decreased further.

Figure 16:
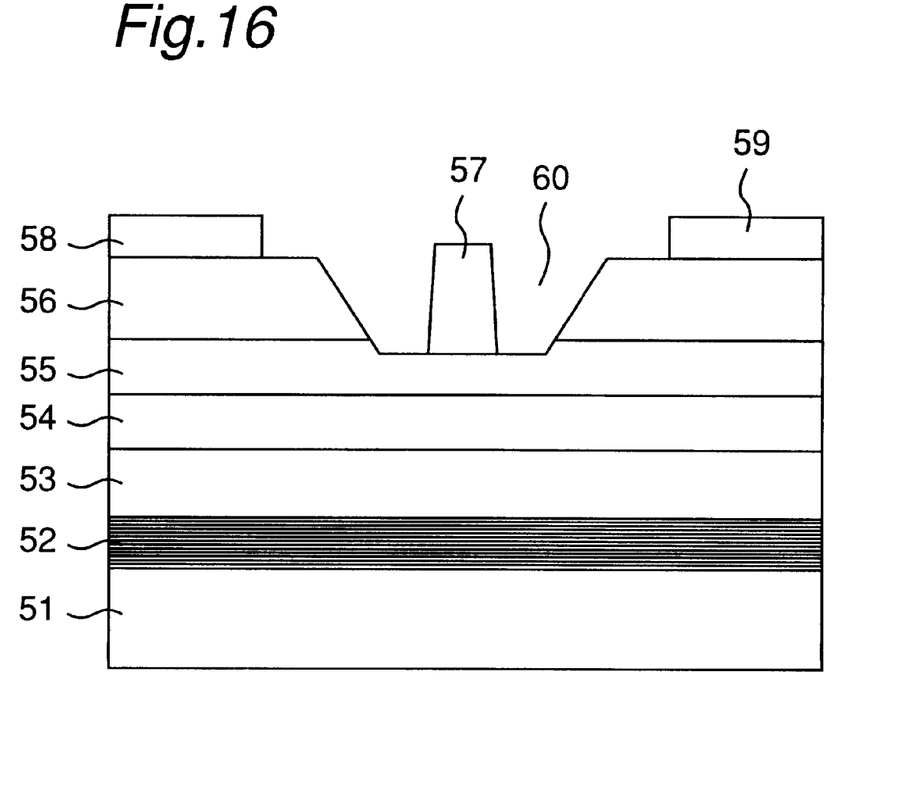
FIG. 16 is a schematic sectional view of a hetero-junction FET.

The above-mentioned structures which use a crystalline layer for facilitating the re-combination of carriers can be applied to all FET elements such as insulating gate field effect transistor (MISFET), a Schottkey gate field effect transistor (MESFET) and a hetero-junction field effect transistor (HFET). FIG. 16 shows a structure of a hetero-junction FET. On a substrate 51, a superlattice buffer layer 52 including doped oxygen, an undoped GaAs layer 53, a channel layer (n-GaAs) 54 and an n-AlGaAs layer 55 are grown successively. Further, an n⁺-GaAs layer 56 is formed thereon, and a gate 57 is formed a recess groove 60 at the center thereof. Further, a source electrode 58 and a drain electrode 59 are formed on the n⁺-GaAs layer 56.

Although the present invention has been fully described above in connection with the various embodiments, it is to be noted that various changes and modifications included in the appended claims are to be understood as included within the scope of the present invention.

What is claimed is:

1. A field effect transistor comprising:
    a channel layer made of a compound semiconductor;
    a first compound semiconductor layer formed below said channel layer and having a higher resistance than said channel layer; and
    a second compound semiconductor layer formed below said first compound semiconductor layer and facilitating non-radiative re-combination of carriers.

2. The field effect transistor according to claim 1, wherein said second compound semiconductor layer comprises a layer made of a material including aluminum, and oxygen is introduced in the material including aluminum.

3. The field effect transistor according to claim 1, wherein said second compound semiconductor layer comprises a superlattice structure consisting of layers made of a plurality of different crystalline materials and at least a part of the layers facilitate the non-radiative re-combination of carriers.

4. The field effect transistor according to claim 3, wherein said superlattice structure consists of layers made of a semiconductor crystalline material including aluminum and layers made of another semiconductor crystalline material substantially without aluminum.

5. The field effect transistor according to claim 4, wherein said superlattice structure has a structure wherein $Al_xGa_{1-x}As$ (x>0) layers and $Al_yGa_{1-y}As$ (x>y≧0) layers are layered alternately, and oxygen concentration in said $Al_xGa_{1-x}As$ layers is in a range from $1*10^{17}$ to $2*10^{19}$ cm$^{-3}$.

6. The field effect transistor according to claim 5, wherein the oxygen concentration in said $Al_xGa_{1-x}As$ layers is in a range from $1*10^{18}$ to $7*10^{18}$ cm$^{-3}$.

7. The field effect transistor according to claim 1, wherein said second compound semiconductor layer comprises a layer wherein both of n-type and p-type dopants are mixed at about the same degree.

8. The field effect transistor according to claim 1, wherein said second compound semiconductor layer is a layer formed with crystal growth at a temperature lower by 20 to 200° C. than that of said channel layer.

9. The field effect transistor according to claim 8, wherein said second compound semiconductor layer is a layer formed with crystal growth at a temperature lower by 20 to 200° C. than that of said channel layer.

10. The field effect transistor according to claim 9, wherein said second compound semiconductor layer is a layer formed with crystal growth at a temperature lower by 100 to 150° C. than that of said channel layer.

11. The field effect transistor according to claim 2, wherein said second compound semiconductor layer comprises a superlattice structure consisting of layers made of a plurality of different crystalline materials and at least a part of the layers facilitate the non-radiative re-combination of carriers.

12. The field effect transistor according to claim 11, wherein said superlattice structure consists of layers made of a semiconductor crystalline material including aluminum and layers made of another semiconductor crystalline material substantially without aluminum.

13. The field effect transistor according to claim 12, wherein said superlattice structure has a structure wherein $Al_xGa_{1-x}As$ (x>0) layers and $Al_yGa_{1-y}As$ (x>y>0) layers are layered alternately, and oxygen concentration in said $Al_xGa_{1-x}As$ layers is in a range from $1*10^{17}$ to $2*10^{19}$ cm$^{-3}$.

14. The field effect transistor according to claim 13, wherein the oxygen concentration in said $Al_xGa_{1-x}As$ layers is in a range from $1*10^{18}$ to $7*10^{18}$ cm$^{-3}$.

15. The field effect transistor according to claim 2, wherein said second compound semiconductor layer comprises a layer wherein both of n-type and p-type dopants are mixed at about the same degree.

16. The field effect transistor according to claim 3, wherein said second compound semiconductor layer comprises a layer wherein both of n-type and p-type dopants are mixed at about the same degree.

* * * * *